(12) United States Patent
Brenner et al.

(10) Patent No.: US 7,863,578 B2
(45) Date of Patent: Jan. 4, 2011

(54) DETECTOR FOR RADIATION THERAPY

(76) Inventors: Richard Brenner, Bernadottevägen 29, Uppsala (SE) 756 48; Leif Gustafsson, Åskmolnsvägen 56, Storvreta (SE) 743 35; Lilian Del Risco Norrlid, Anders Lundströms gata 16, Solna (SE) 169 73; Fredrik Edling, Stenhagsvägen 130, Uppsala (SE) 752 60

( * ) Notice: Subject to any disclaimer, the term of this patent is extended or adjusted under 35 U.S.C. 154(b) by 0 days.

(21) Appl. No.: 12/449,961

(22) PCT Filed: Mar. 6, 2008

(86) PCT No.: PCT/SE2008/050250
§ 371 (c)(1), (2), (4) Date: Sep. 4, 2009

(87) PCT Pub. No.: WO2008/108734
PCT Pub. Date: Sep. 12, 2008

(65) Prior Publication Data
US 2010/0051823 A1    Mar. 4, 2010

(30) Foreign Application Priority Data
Mar. 6, 2007  (SE) .................................. 0700567

(51) Int. Cl.
*H01J 47/00* (2006.01)
(52) U.S. Cl. ..................................................... 250/389
(58) Field of Classification Search ................ 250/389, 250/370.01–370.15, 390.03, 388; 378/98.8
See application file for complete search history.

(56) References Cited

U.S. PATENT DOCUMENTS

| | | | |
|---|---|---|---|
| 5,929,449 A * | 7/1999 | Huang | 250/370.09 |
| 6,066,851 A | 5/2000 | Madono et al. | |
| 7,079,189 B2 | 7/2006 | Tsujii et al. | |
| 2002/0085672 A1 * | 7/2002 | Ganin et al. | 378/108 |

FOREIGN PATENT DOCUMENTS

| | | |
|---|---|---|
| DE | 196 47 235 A1 | 5/1998 |
| DE | 197 51 545 A1 | 5/1998 |
| EP | 1 179 741 B1 | 2/2002 |
| GB | 2 343 577 A1 | 5/2000 |

(Continued)

OTHER PUBLICATIONS

Eid et al., "Design and characterization of ionizing radiation-tolerant CMOS APS image sensors up to 30 Mrd (Si) total dose," 2001, IEEE Transaction on Nuclear Science vol. 48, No. 6, pp. 1796-1806.*

(Continued)

*Primary Examiner*—David P Porta
*Assistant Examiner*—Kiho Kim
(74) *Attorney, Agent, or Firm*—Foley & Lardner LLP (57) ABSTRACT

A detector device for radiation therapy comprising an array of detector cells is provided. Each detector cell comprises an electronic circuit connected to a sensor cell that generates a charge signal in response to an incident radiation hit. The electronic circuit comprises at least two discriminators and at least two analogue counters, and is adapted to substantially simultaneously perform two different measurements on the signal in order to simultaneously provide imaging and dosimetry.

15 Claims, 10 Drawing Sheets

FOREIGN PATENT DOCUMENTS

WO          WO 95/33332 A2    12/1995

OTHER PUBLICATIONS

International Search Report mailed Jun. 11, 2008 in PCT/SE2008/050250, 3 pages.

Edling, Fredrik, "DIXI—a Hybrid Pixel Detector for X-ray Imaging," Thesis, Upssala University, Sweden, published Sep. 24, 2004, 74 pages.

Löf et al., "An adaptive control algorithm for optimization of intensity modulated radiotherapy considering uncertainties in beam profiles, patient set-up and internal organ motion," Phys. Med. Biol., 1998, 43:1605-1628.

* cited by examiner

DETECTOR FOR RADIATION THERAPY

CROSS-REFERENCE TO RELATED APPLICATIONS

This application is a National Stage application of PCT/SE2008/050250, filed Mar. 6, 2008, which claims priority from Swedish application SE 0700567-1, filed Mar. 6, 2007.

TECHNICAL FIELD OF THE INVENTION

The present invention relates to methods and devices for portal imaging and exit dosimetry in radiation therapy.

BACKGROUND OF THE INVENTION

Figure 1:
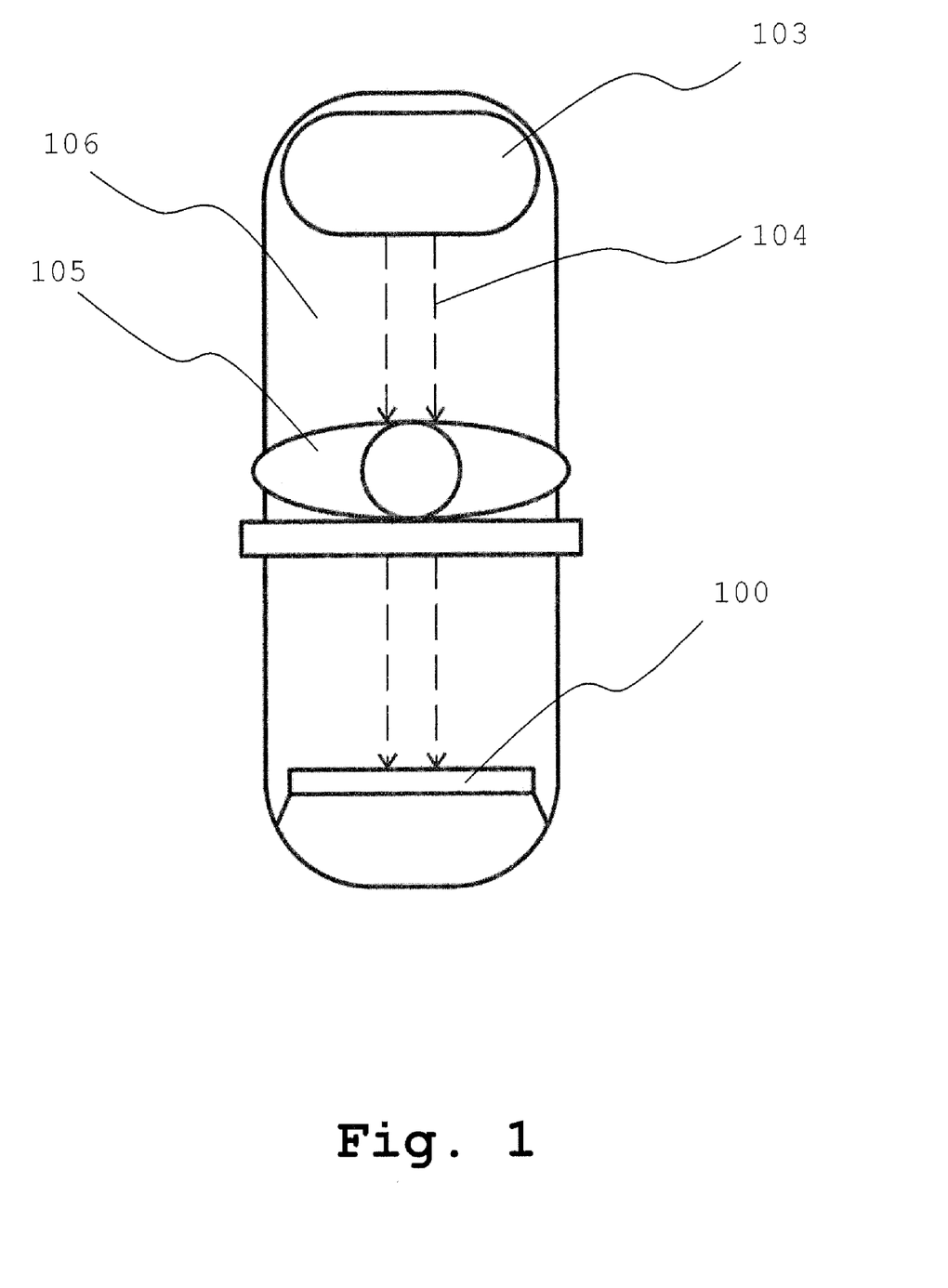
FIG. 1 is a schematic view of the geometry of a radiotherapy machine gantry.

Radiation therapy, also called radiotherapy, is an important tool in medicine, particularly in therapeutic cancer treatment, where ionizing radiation is used to control malignant cells found, for example, in malignant tumors. The doses of radiation used in radiation therapy are significantly higher than those used in radiology i.e. medical imaging and diagnosis. Usually the radiation is applied using an external radiation source, an accelerator, which generates a beam of high-energy photons. The photons will predominantly, through Compton scattering, produce secondary electrons. Most high energetic electrons will continue in almost the same direction as the scattered photon while low energetic electrons will move randomly in other directions. The ionizing radiation may alternatively comprise other particles such as electrons, protons, etc. Normally the accelerator is mounted on top of a gantry, and the radiation beam is directed towards the patient under treatment who is positioned in the middle of the gantry, as illustrated in FIG. 1. Detectors for imaging and dosimetry are placed in the bottom part of the gantry in order to detect radiation that has passed through the patient.

A radiation beam damages cells by ionization of the atoms in the DNA molecules and the objective of radiation therapy is to attain a high dose to the tumor, while the dose to the surrounding tissue is minimized in order to avoid harmful side effects. The harmful effect on surrounding normal tissue and the skin can be reduced by applying the treatment during a plurality of sessions. However, it is more efficient and safer to reduce the dose applied to normal tissue during the treatment, e.g. by applying the radiation in small doses transmitted from a plurality of angles so that each dose takes a different path through normal tissue. Moreover, the treatment volume may be adapted so that it conforms to the shape of the tumor by shaping the beam, whereby the relative toxicity of radiation to the surrounding normal tissues is reduced, allowing a higher dose of radiation to be delivered to the tumor. In intensity-modulated radiation therapy (IMRT), which has been one of the most important advances in conformal radiotherapy, the profile of the beam is shaped and the intensity of the beam over the cross-sectional area of the beam is varied, conforming the treatment volume further.

Conventional radiotherapy treatment requires thorough dose planning, access to calibrated radiation sources and methods for dosimetry. The first step in the planning is to anatomically localize the tumor and to identify the absorption properties of the surrounding tissue. One of the most useful tools in this is computed tomography (CT). Thereafter the kind of radiation beam, i.e. photon, electron or proton beam, the shape, directions and energy thereof, distance to radiation source target dose, etc. are selected. For accurate planning and treatment the radiation sources needs to be calibrated, which conventionally is accomplished using ionization chambers or other detectors placed in so-called phantoms prior to the treatment. During treatment dosimetry detectors are used in specific locations only for monitoring purposes in order to protect the patient from overdose. Photographic imaging would be much more convenient, but is however not feasible due to reasons explained in the following. A final plan for the radiation treatment is established by simulation and the treatment is performed essentially based on this plan. Treatment verification today involves comparison of an image acquired during a treatment fraction with a reference image that is generated prior to the initiation of the treatment. The alignment of the beam is normally determined from an X-ray image (kEV-beam) of the patient acquired immediately before the treatment starts.

Without real-time field monitoring during the therapy process there is a risk that errors during the planning examination or changes in conditions after the X-ray examination or during treatment, e.g. due to inadequate patient immobilization, may lead to reduced efficiency of the therapy and/or damage to surrounding natural tissue. Especially with IMRT, verification of the actual dose intensity and position is important and a fast feedback between the accelerator providing the beam and a detector monitoring the field is invaluable. A correction of the patient set-up using the information from a beam monitor increases the probability of a complication-free tumor cure in 10% of cases (J. Löf, B. K. Lind and A. Brahme, Phys. Med. Biol, 43, p 1605-1628, 1998).

In radiology there are several methods for imaging: X-ray imaging, computed tomography (CT), and positron emission tomography (PET) to mention just a few. These and other methods are however not adapted to the high energy beams used in radiation therapy.

Portal imaging provides an image of the irradiated region using the therapeutic beam. The conventional imaging media is photographic film, but electronic portal imaging devices (EPID) are becoming common. Images with fairly high quality can be produced using portal imaging films, but one inherent drawback is that the film has to be processed and normally also digitized before it is possible to obtain any feedback on the radiation therapy process. At best EPIDs enable real-time images and at worst they at least remove the time-consuming step of transferring the films to a (digitized) format wherefrom analysis can be made. The geometrical information provided by portal imaging is mainly used to ensure that the target region for the treatment (e.g. a tumor) is in the correct position during the treatment.

Several electronic portal imaging systems are already commercially available and the dominating technologies are either camera-based or liquid ion chamber arrays. Lately amorphous silicon based electronic portal imaging devices have received increasing attention. The image quality for currently available instruments is usually rather poor.

In nearly all commercial detectors for medical X-ray imaging the principle of charge integration is used. In charge integration detectors, such as charge-coupled devices (CCD) and flat panel detectors (FPD), the noise is added to the total deposited energy and the incident photons are given a weight proportional to the amount of charge deposited, i.e. proportional to the photon energy. Devices that utilize a photon counting principle are currently appearing. In photon counting detectors all photons that deposit a charge larger than a predefined threshold give an equal counter response. No information about the energy of the photon is preserved.

Imaging devices generally comprise an array of detector cells. Incoming radiation generates a charge in the detector cell that is read out either in sequence from all of the cells to a common output circuit or each detector cell is connected to a separately addressable circuit, which enables charge detection from individual cells. WO95/33332 discloses an imaging device with an array of individually addressable imaging cells wherein successive photon hits can be accumulated and read out from each cell after a certain time period. These devices are not able to distinguish between different photon energies. The international application WO98/16853 "Imaging Device for Imaging Radiation" discloses another imaging device with a similar arrangement of an array of image cells and individually addressable circuits connected to each image cell, wherein each circuit comprises an additional counting circuit. Thereby the number of radiation hits can be read out together with the accumulated charge.

There is an increasing demand for portal imaging devices able to determine the patient dose in addition to the geometrical information. The requirements for dosimetry and imaging are very different, hence a good image can not readily be extracted from dosimetry data and, similarly, dose cannot be accurately estimated from an image.

In general, geometric verification requires the portal image to be registered with a reference image and dosimetric verification requires the portal imager to be calibrated for dose. Therefore real-time imaging combined with real-time adjustment of the therapeutic beams is not easily performed using conventional technology.

The contrast in an image can be enhanced by single photon counting, wherein the signal generated in the detector cell is compared with a predefined threshold level enabling only hits within a predetermined energy range to be counted. In this way so-called soft photons, i.e. low energy photons originating from scattering, that dilute the image can be excluded. Single photon counting is however not advantageous for measuring dose, since the important energy information of the photon is lost in the discrimination process.

SUMMARY OF THE INVENTION

Prior art radiotherapy devices have drawbacks with regard to being able to simultaneously perform portal imaging and to measure exit dose.

The object of the present invention is to overcome some of the drawbacks of the prior art. This may be achieved by a device and the method as defined in the independent claims.

A device according to the present invention comprises an array of detector cells, wherein each detector cell comprises an electronic circuit connected to a sensor cell that generates a charge signal in response to an incident radiation hit. Initially the charge signal is converted to a voltage signal in the electronic circuit. The electronic circuit is adapted to substantially simultaneously perform two different measurements on the voltage signal in order to simultaneously provide imaging and dosimetry.

An electronic circuit according to the invention further preferably comprises at least two discriminators and at least two analogue counters. Initially the voltage signal is duplicated into a first and a second discriminator respectively, wherein the first discriminator is adapted to compare the voltage signal with a first threshold level, and a first analogue counter for dosimetry connected to the first discriminator is adapted to integrate a voltage signal exceeding the first threshold level; and the second discriminator is adapted to compare the voltage signal with a second threshold level and a third threshold level, the third threshold level being higher than the second threshold level, defining an energy window, and a second analogue counter for counting single radiation hits connected to the second discriminator is adapted to record a radiation hit when a voltage signal is within the energy window.

A method to perform two different measurements on a signal induced by an incident radiation hit in a sensor cell in order to simultaneously perform imaging and dosimetry is disclosed. The method comprises the steps of duplicating the voltage signal into two discriminators, comparing the voltage signals with threshold levels, and substantially simultaneously integrating voltage signals exceeding one threshold level and counting radiation hits for voltage signals exceeding another threshold level.

Thanks to the devices and methods in accordance with the present invention it is possible to provide simultaneous imaging and dosimetry in radiation therapy due to two different measurements being performed on a single incident particle.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein.

DETAILED DESCRIPTION OF EMBODIMENTS

The present invention provides a detector device 100 for radiation therapy that, by monitoring the radiation process and measuring the dose deposited in the patient 105, ultimately improves the dose planning and the quality of treatment while also reducing the risk of incorrect treatment of the patient. The detector 100 enables combined portal imaging and dosimetry, by being adapted to perform two measurements of a single incident particle.

Although described for radiation therapy applications, the present invention may be implemented as a detector in e.g. space technology and different analytical methods such as methods requiring X-ray with excellent time resolution. Furthermore, as treatment using photon radiation is dominating, the description use examples relating to the detection of secondary electrons generated by Compton scattering of the photon radiation, however the invention is not limited to this. Detection of proton, photons or other ionizing radiation, i.e. particles, may also be used in combination with the present invention.

Figure 2:
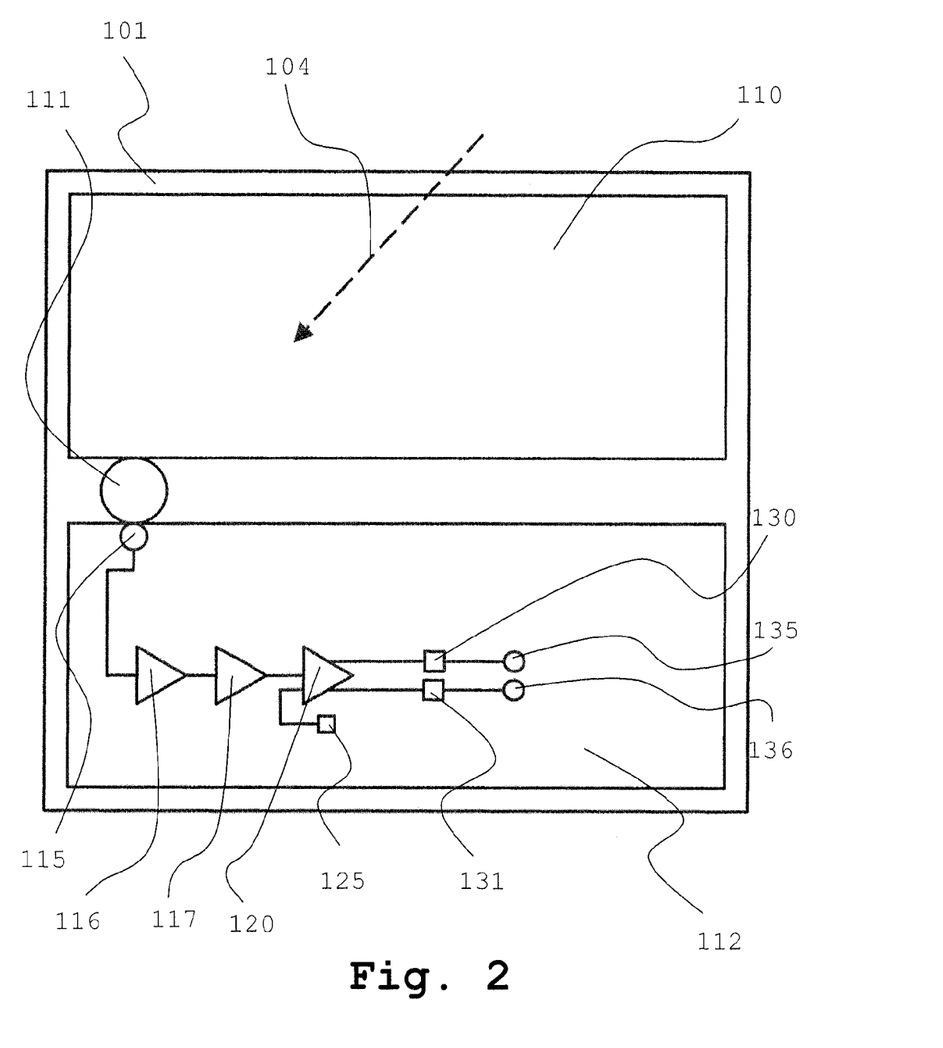
FIG. 2 is a schematic view of a detector cell in a prior art hybrid pixel detector.

The detector 100 of the present invention is based on a detector concept disclosed in a thesis from Uppsala University, Sweden, entitled "DIXI—a Hybrid Pixel Detector for X-Ray Imaging" by Fredrik Edling, published on 24 Sep. 2004. In contrast to e.g. charge-coupled devices and flat panel detectors, wherein a electronic circuit simply integrates the signal originating from incident ionizing radiation 104, a more advanced signal processing capability is achievable using a hybrid pixel detector. The detector 100 comprises an array of detector cells 101, wherein each detector cell 101 is divided into a sensor 110 for ionized radiation, electronics 112, preferably in the form of an application specific integrated circuit (ASIC), interconnections 111 between the sensor 110 and the electronics 112, and a versatile and compact data collection system. FIG. 2 schematically illustrates a cell of such a hybrid pixel detector cell 101, The main features of the DIXI detector cell 101 are: a photon counting capability, an adjustable signal threshold circuit 125 and the implementation of two analogue counters 130, 131. The two counters 130, 131 make it possible to acquire two images at very close time intervals, i.e. as close in time as 1 µs.

Figure 3:
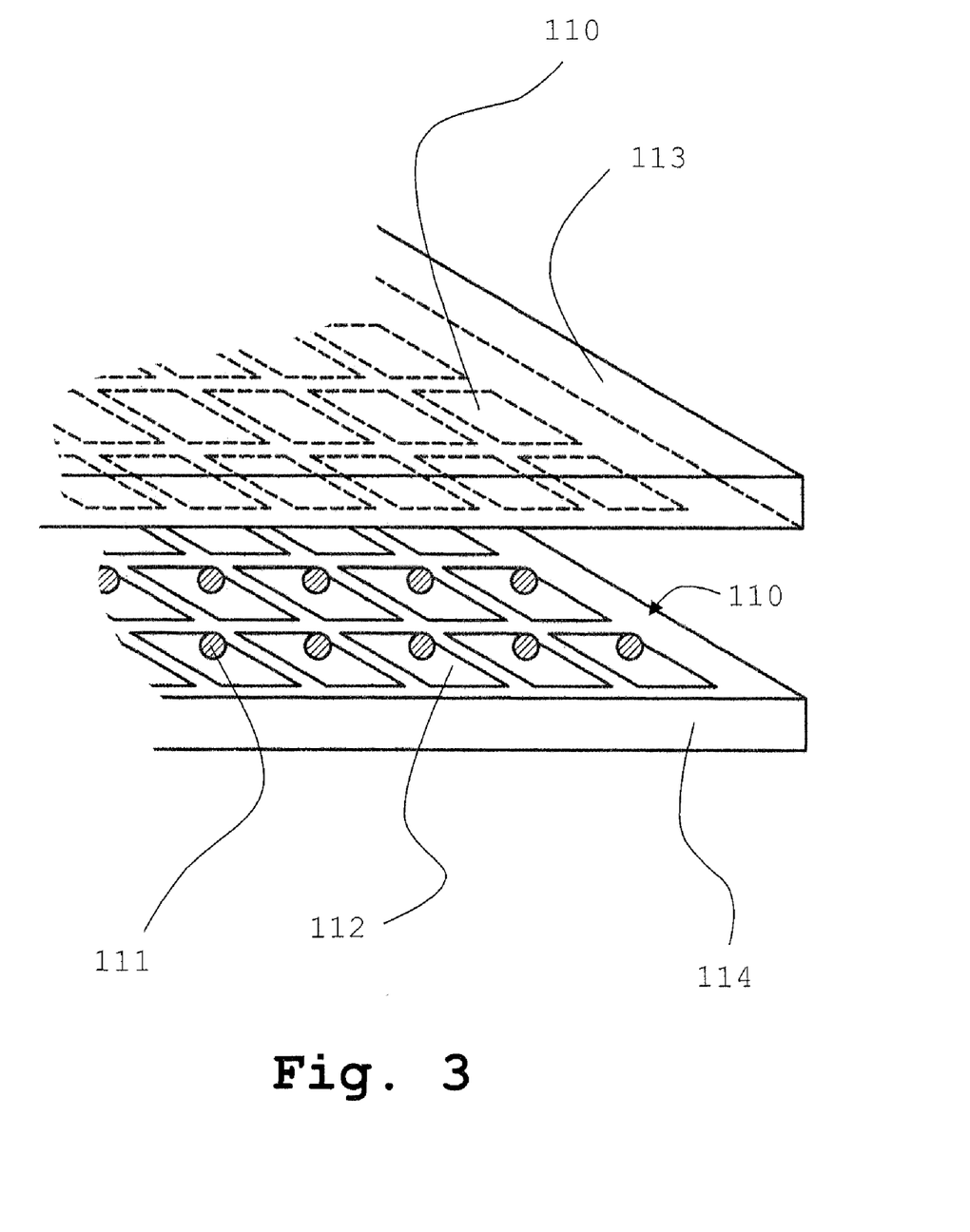
FIG. 3 is a schematic perspective view of an array of hybrid pixel detector cells.

Referring to FIG. 3, the electronics circuit 114 can be divided into a one- or two-dimensional array of pixels, each representing an independent cell or channel 101 comprising the sensor part 110, the interconnection part 111 and the electronic part 112. The choice of pixel size requires a compromise between statistical accuracy and quality of imaging. If the pixels become too small then statistical accuracy deteriorates and crosstalk between pixels increase and, in contrast, when the pixels become too large then image resolution is low. As shown in FIG. 2, each channel 101 has a preamplifier 116 converting the charge signal induced in the sensor to a voltage signal, a shaper circuit 117 for filtering noise and a comparator 120 where the input signal is compared with a predefined threshold voltage defined in the threshold circuit 125. The shaper 117 is in its simplest form a RC-CR filter that shapes the signal to a semi-gaussian pulse form. If the voltage signal is above the threshold the counter 130 placed after the comparator 120 is incremented, and the information is stored until it is subsequently read out. By selecting threshold voltages one can choose a harder or softer part, i.e. a high or low energy part respectively, of the Compton electron spectrum which is generated by the incident photon radiation delivered by the radiotherapy accelerator 103 on top of the gantry 106. When detecting photons, this technique is usually called single photon counting and is commonly used to enhance the contrast in X-ray imaging. The invention in the following description is illustrated by examples of electron detection, and this technique is in this application analogously hereinafter referred to as the more general term single particle counting. A dominant part of the soft electrons are scattered multiple times which dilutes the image, hence energetic minimally ionizing electrons are favored. A device using two threshold circuitries (i.e. an upper threshold circuit and a lower threshold circuit) connected to each discriminator is conceivable in a device made in accordance with the present invention.

The spectrum of the radiation beam does not change much due to its passage through the body and the sensor behavior for the radiation beam used is normally well known, which implies that a model for the detection system can be established and used to analyze and modify the output from the detector system.

Single particle counting is generally not useful for measuring dose since the energy information of the particle is lost in the discrimination process. If the charge induced by the particles, such as e.g. the photons or the electrons, is directly integrated, or if the counter weights the counting steps with energy, then the dose can be calculated from knowing the efficiency of the sensor 110 and the spectrum of the radiation beam 104.

Figure 4A:
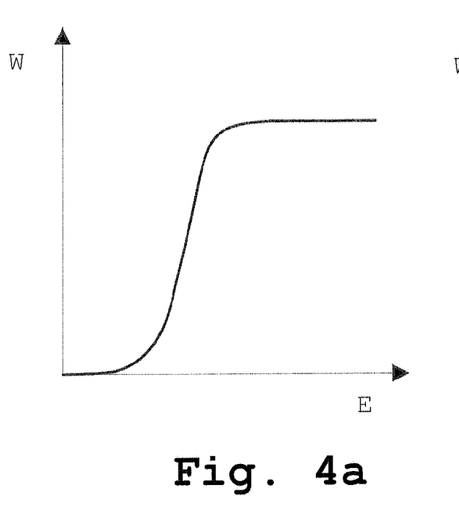
FIGS. 4a and 4b are a schematic diagram showing the weighting of the counting with energy of the radiation beam in a (a) single photon counting device, and (b) single electron counting device for imaging.

Referring to FIG. 4a, in a single photon counting device for imaging, a high-energy photon is given a weighting which is much higher than that given to a low-energy photon, however not limited to this, and the weighting W with respect to the energy E has an abrupt, step-like increase at a certain threshold energy.

Figure 4B:
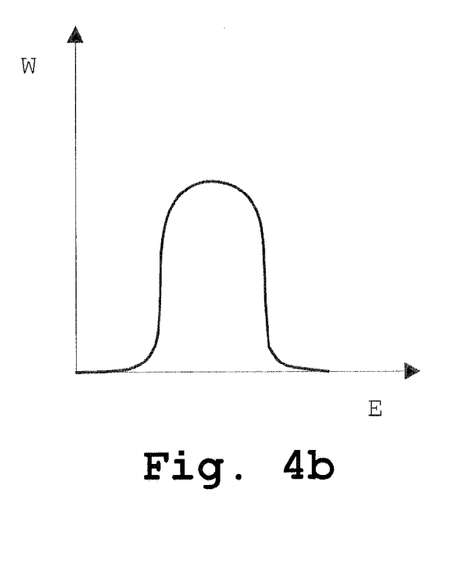

Referring to FIG. 4b, in an electron counting device the situation is the opposite of that in a photon counting device since low energy electrons loose more energy in a thin detector layer whereby they deposit more energy than a high energy minimally ionizing electron. A minimally ionizing electron deposits about 3.5 fC charge in a 300 µm thick silicon layer. Accordingly a discriminator with a lower and an upper threshold, in the following referred to as a second and a third threshold, respectively, to define an energy window is preferably used to select these particles.

Figure 5:
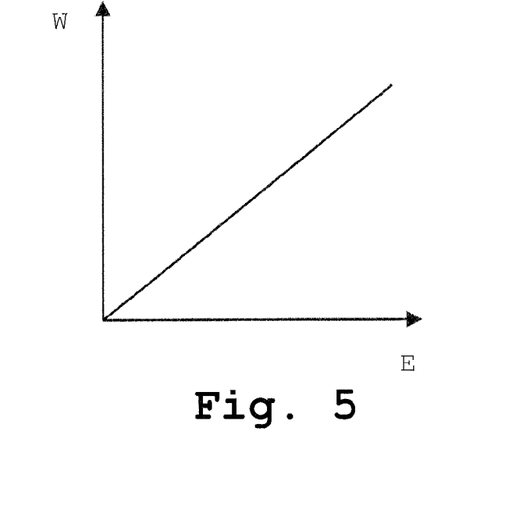
FIG. 5 is a schematic diagram showing the weighting of the counting with energy of the radiation beam in a linear integrating device for dosimetry.

Referring to FIG. 5, on the other hand, using a linear integrating device for dosimetry, weight W is proportional to the energy E deposited in the sensor by the particle. As described above, in single particle counting devices the information obtained from the instrument (the "read out") is the number of radiation hits on a sensor or a pixel of a sensor. The implementation of a discriminator 120 with a threshold makes it possible to count only hits above a certain energy level. Implementation of an additional discriminator with a different threshold makes it possible to count hits within a certain energy window. Accordingly more information can be extracted from the incident radiation. Energy weighting of the signal induced by incident radiation requires the use of a plurality of discriminators and counters. To be able to perform simultaneous measurements of this kind using digital counters according to prior art, an analogue-to-digital converter (ADC) has to be included inside every pixel of the sensor cell. This is not possible in particular because such an arrangement would have a too large current consumption, unrealistic requirements on the speed of the electronics and problems with crosstalk between pixels. The aforementioned DIXI detector has one discriminator and two analogue counters enabling acquisition of images very close in time by operating the counters in alternately, e.g. two images separated by 1 µs, although not simultaneously.

Figure 6A:
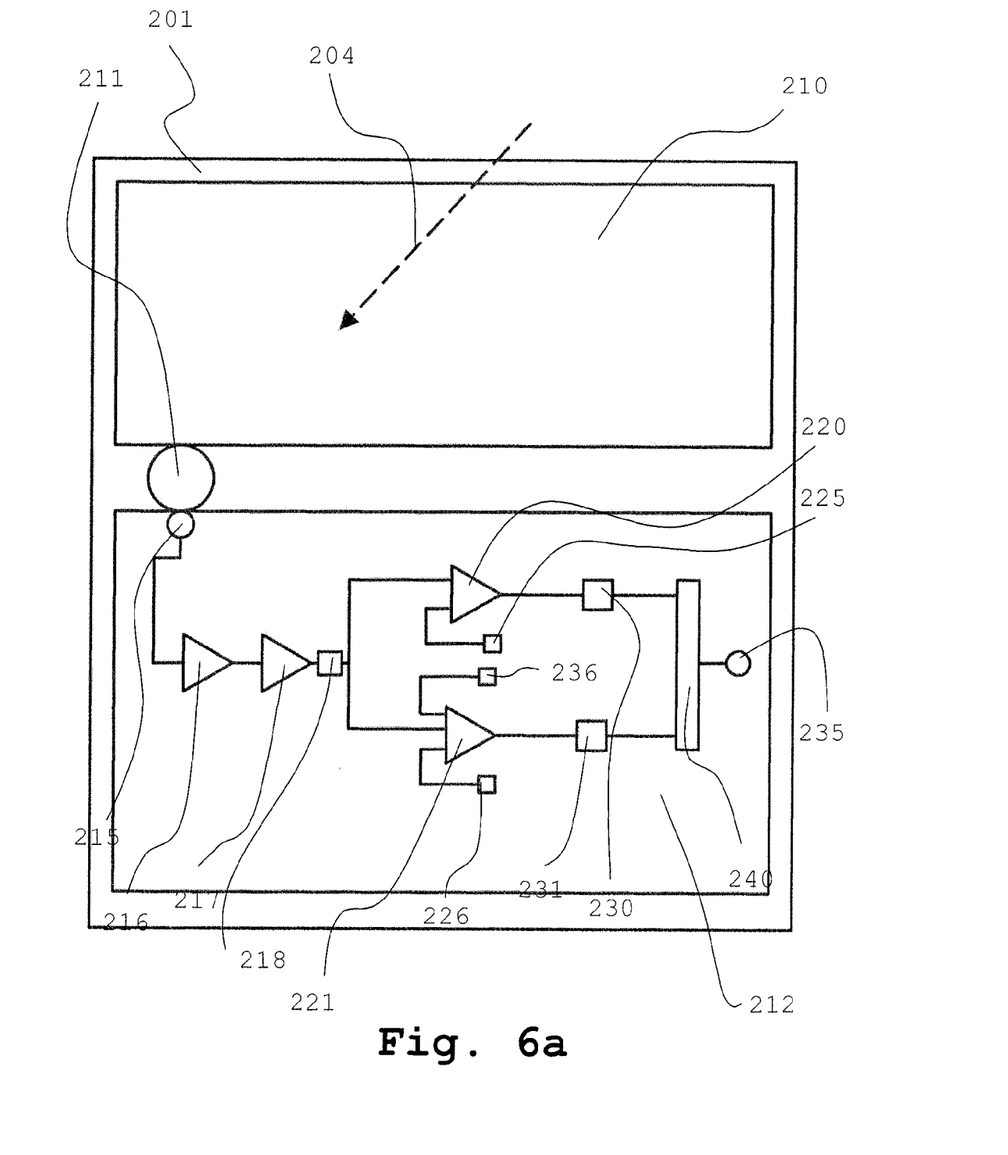
FIGS. 6a and 6b are a schematic view of a detector cell comprising (a) three threshold levels, and (b) two threshold levels according to the present invention.

FIG. 6a illustrates a schematic circuit diagram of an electronic circuit 212 for one detector cell 201 according to the present invention. In contrast to prior art single photon counting devices with a plurality of discriminators and counters, the counters 230, 231 in the present invention are analogue. The signal from the sensor 210 is generally CRC-shaped with an exponential behavior. A high amplitude results in a long pulse width since the time for the signal to decay below the threshold becomes long. When a voltage signal, originating from an incident particle 204 in the sensor 210, falls within the energy window defined by a second (lower) and an third (upper) threshold in the discriminator 220, 221 of the present invention, a small charge with a fixed value, corresponding to a bit flip in a digital counter, is injected into a capacitor. Preferably, to obtain a single particle counting transfer function, a flip-flop that injects a fixed amount of charge into the analogue counter 230 is introduced, which removes the time over threshold feature of the discriminator. The amount of charge is predefined or the circuit is adapted to make it possible to adjust the amount of charge injected to the capacitor. The dynamic range can be adjusted by adjusting the amount of charge injected to the capacitor. Only electrons generating a signal within the window defined by the second and third thresholds are counted. The discriminator 221 is tuned to have a linear response utilizing the time over threshold feature. In this case a charge with a size that is scaled to the size of the input pulse is pumped into the capacitor resulting in an almost linear transfer function. All electrons contribute to the dose in proportion to their corresponding deposited energy.

An electronic circuit 212 in accordance with the present invention comprises at least two discriminators 220, 221 and at least two analogue counters 230, 231 for each detector cell 201. The voltage signal originating from an incident photon 204 is duplicated into a first and a second discriminator 220, 221 respectively. The first discriminator 220 is adapted to compare the voltage signal with a first threshold level defined by a first threshold circuit 225, and a first counter 230 for dosimetry connected to the first discriminator 220 is adapted to integrate a voltage signal exceeding the first threshold level defined by a first threshold circuit 226. The second discriminator 221 is adapted to compare the voltage signal with a second and a third threshold level wherein the third threshold level is higher than the second threshold level defined by a second and a third threshold circuit 226, 236, the second and the third threshold levels defining an energy window, and a second counter 231 for counting single electrons is connected to the second discriminator 221 and is adapted to record a single electron for each voltage signal that falls within the energy window defined by the two thresholds. The threshold levels are either predefined or adapted to be adjustable.

In one embodiment of the present invention the electronic circuit comprises three discriminators instead of having two threshold circuits coupled to the second discriminator. Thereby the first discriminator is used as the first discriminator described above, and the other two discriminators are used to define the second and third threshold level.

Figure 6B:
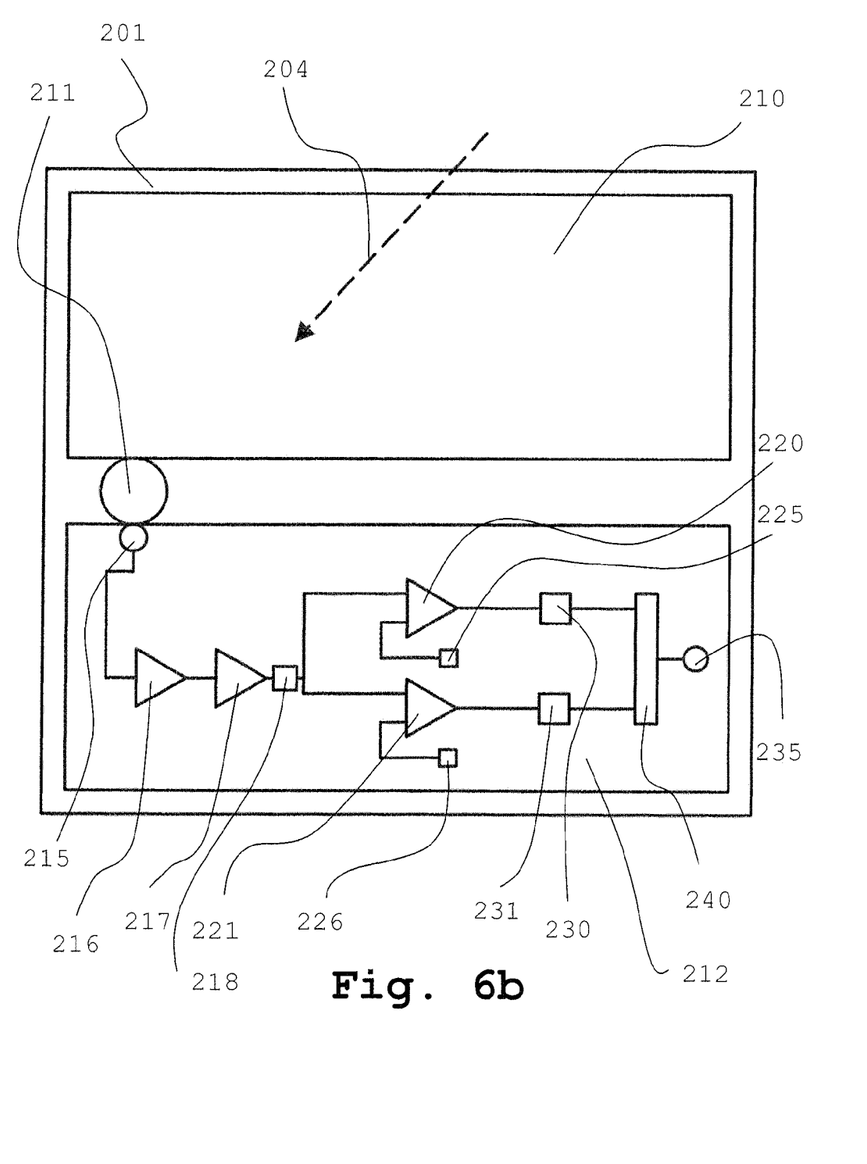

FIG. 6b illustrates a schematic diagram of an electronic circuit 212 for one detector cell 201 adapted for single photon counting according to the present invention. When a voltage signal, originating from an incident photon 204 in the sensor 210, falls within the energy window defined by a lower and an upper threshold in the discriminator 220, 221 of the present invention, a small charge with a fixed value, corresponding to a bit flip in a digital counter, is injected into a capacitor. Preferably, to obtain a single photon counting transfer function, a flip-flop that injects a fixed amount of charge into the analogue counter 230 is introduced, which removes the time over threshold feature of the discriminator. The amount of charge is predefined or the circuit is adapted to make it possible to adjust the amount of charge injected to the capacitor. The dynamic range can be adjusted by adjusting the amount of charge injected to the capacitor. Only photons generating a signal exceeding the threshold are counted. The discriminator 221 is tuned to have a linear response utilizing the time over threshold feature. In this case a charge with a size that is scaled to the size of the input pulse is pumped into the capacitor resulting in an almost linear transfer function. All photons contribute to the dose in proportion to their corresponding deposited energy. An electronic circuit 212 in accordance with this embodiment comprises at least two discriminators 220, 221 and at least two analogue counters 230, 231 for each detector cell 201. The voltage signal originating from an incident photon 204 is duplicated into a first and a second discriminator 220, 221 respectively. The first discriminator 220 is adapted to compare the voltage signal with a first threshold level defined by a first threshold circuit 225, and a first counter 230 for dosimetry connected to the first discriminator 220 is adapted to integrate a voltage signal exceeding the first threshold level defined by a first threshold circuit 226. The second discriminator 221 is adapted to compare the voltage signal with a second threshold level defined by a second threshold circuit 226, and a second counter 231 for counting single photons is connected to the second discriminator 221 and is adapted to record a single photon for each voltage signal exceeding the second threshold level.

A majority of sensor elements used in available imaging devices are made of polycrystalline material such as amorphous silicon. In the present invention a sensor element made of a single crystalline semiconductor material, such as, but not limited to, silicon is utilized. The semiconducting material GaAs can be used but its properties for dosimetry are not advantageous. As is true for most III-V semiconductors the material has a fairly large amount of defects incorporated in it. An ideal sensor material should have a high band gap and low leakage and be generally free from defects. One good alternative is diamond, which in particular is advantageous for dosimetry since it can withstand high radiation doses. Moreover diamond has few defects and a high band gap. There are processes available for producing high quality diamond films, for example chemical vapor deposition techniques wherein polycrystalline diamond films are deposited. These films with a coarse grained structure are particularly suitable for the detector arrays described herein. Ge is another alternative, but suffers from low band gap and requires cooling and fast electronics. By using single crystal materials for the sensor elements, instead of commonly used polycrystalline materials, e.g. amorphous silicon sensor elements, the response is uniform and predictable.

By fabricating the ASICs in a deep sub-micron CMOS process that is regarded as radiation-hard technology, i.e. with typical line-widths around 0.25 μm or less, the circuits become insensitive to high energy radiation, whereby their lifetime is significantly enhanced without any costly shielding. Due to the large scale production inherent in mature CMOS processing, large sensors and ASIC surfaces with a large number of cells can be produced at a low cost and a large number of sensors and detectors can be produced in parallel on the same wafer. Flip chip assembly of the ASICs 214 onto the sensor 213 is possible and is a standard process in the electronics industry. All of this makes it a very cost-effective fabrication process. Preferably a plurality of ASICs 214 may be mounted onto a single sensor wafer 213. Moreover, the detector device 200 may conveniently be designed to fit in conventional equipment for radiotherapy.

Figure 7:
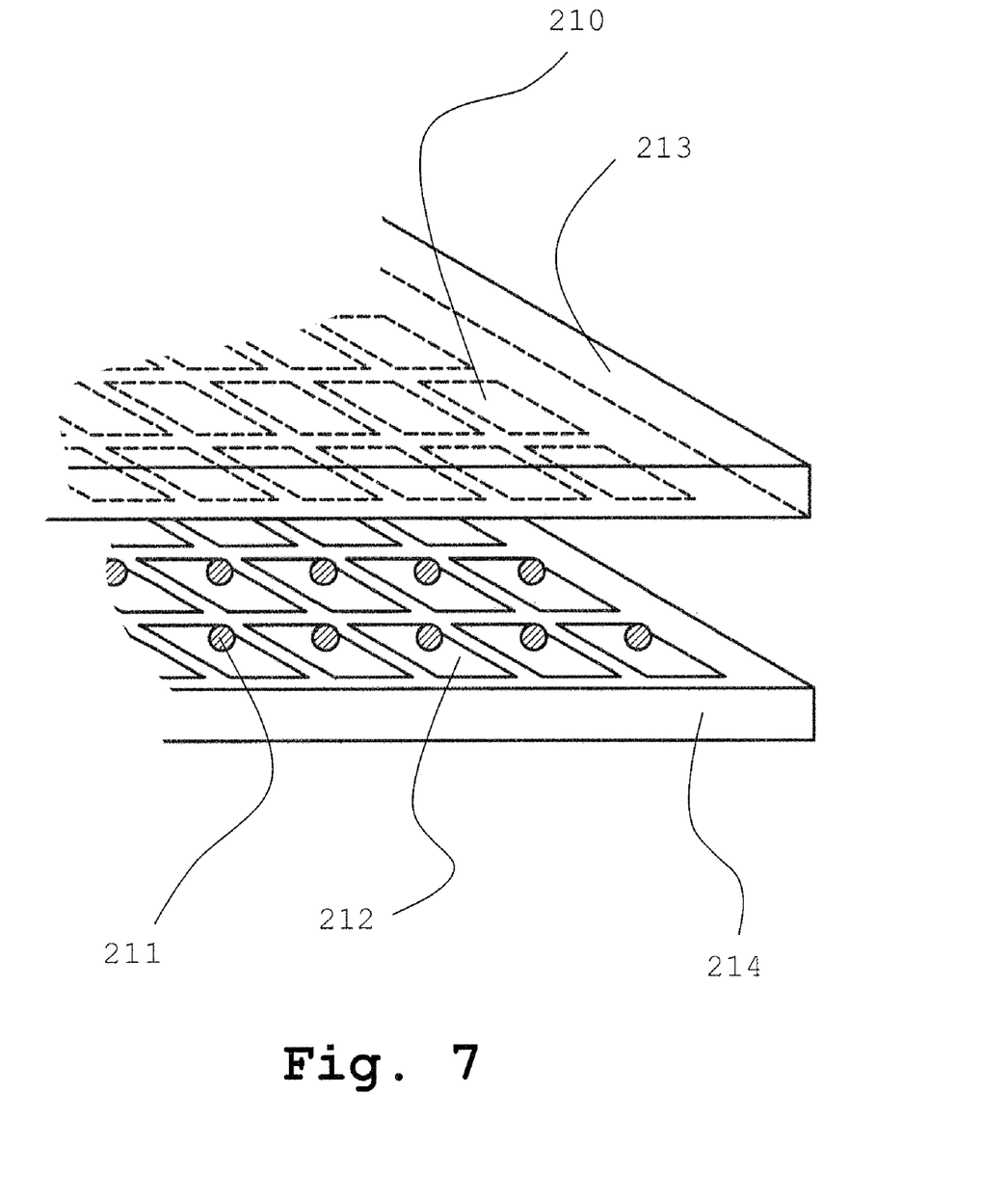
FIG. 7 is a schematic perspective view of an array of detector cells according to the present invention.

Referring to FIGS. 6 and 7, one embodiment of the present invention is a large area detector device, by way of example of 10×10 $cm^2$ or larger, comprising a detector array with a large number, by way of example 31×32 detector cells 201, simultaneously providing two-dimensional imaging and dosimetry. The large area detector device may comprise one or several tiles of moderately or high resistivity crystal silicon wafer divided into sensor pixels with a size fraction of about 1 $mm^2$ to a few $mm^2$, which form the sensor chip 213, and a plurality of ASICs 214 each with a size of e.g. 1×1 $cm^2$, comprising a electronic circuit 212 corresponding to each sensor pixel, are connected to the pixels, either directly e.g. by using flip-chip mounting or through a fan-in structure if the pixel size on the ASIC does not match the pixel size on the crystal silicon wafer, whereby one sensor pixel 210 and one electronic circuit 212 combine to form one detector cell 201. The electronic circuit 212 comprises an input circuit 215, a charge sensitive pre-amplifier 216 for converting the charge signal from the sensor 210 to a voltage signal, a shaper circuit 217 with a shaping time around 100 ns or shorter for filtering noise, two discriminators 220, 221, two counters 230, 231, a readout circuit 240, and at least one output 235. The signal from the shaper is duplicated by a fan-out structure 218 based on a current mirror to a first and a second discriminator 220, 221, where the input signal is compared with adjustable threshold voltages defined by a first, a second and a third threshold circuit 225,226, 236 respectively. Each discriminator 220, 221 has a separate counter 230, 231. The counter 230 of the first discriminator 220 integrates the electron charge for dosimetry. The counter 231 of the second discriminator 221 counts single electrons for imaging. The ASIC design enables good dynamic performance with a possible frame rate exceeding 100 Hz which enables the production of an image every 10 ms. Four-bit digital to analogue converters (DAC) (not shown) are provided in order to adjust for shifts in the baseline between cells in the pixel array. Even a small voltage drop in the power lines across the circuit area will give rise to a systematic shift in the baseline of the discriminator 220, 221 leading to non-uniform sensitivity across the detector 200. If, for example, a 0.25 µm or less e.g. a 0.1 µm CMOS process is utilized for the production of the ASIC the electronics are insensitive to radiation and have a long lifetime even without specific radiation shielding. Readout buffers, multiplexors and registers interface the detector cell to the outside world, but are not explained in detail since a skilled person in the field of electronics design is familiar with such circuitry.

Figure 8:
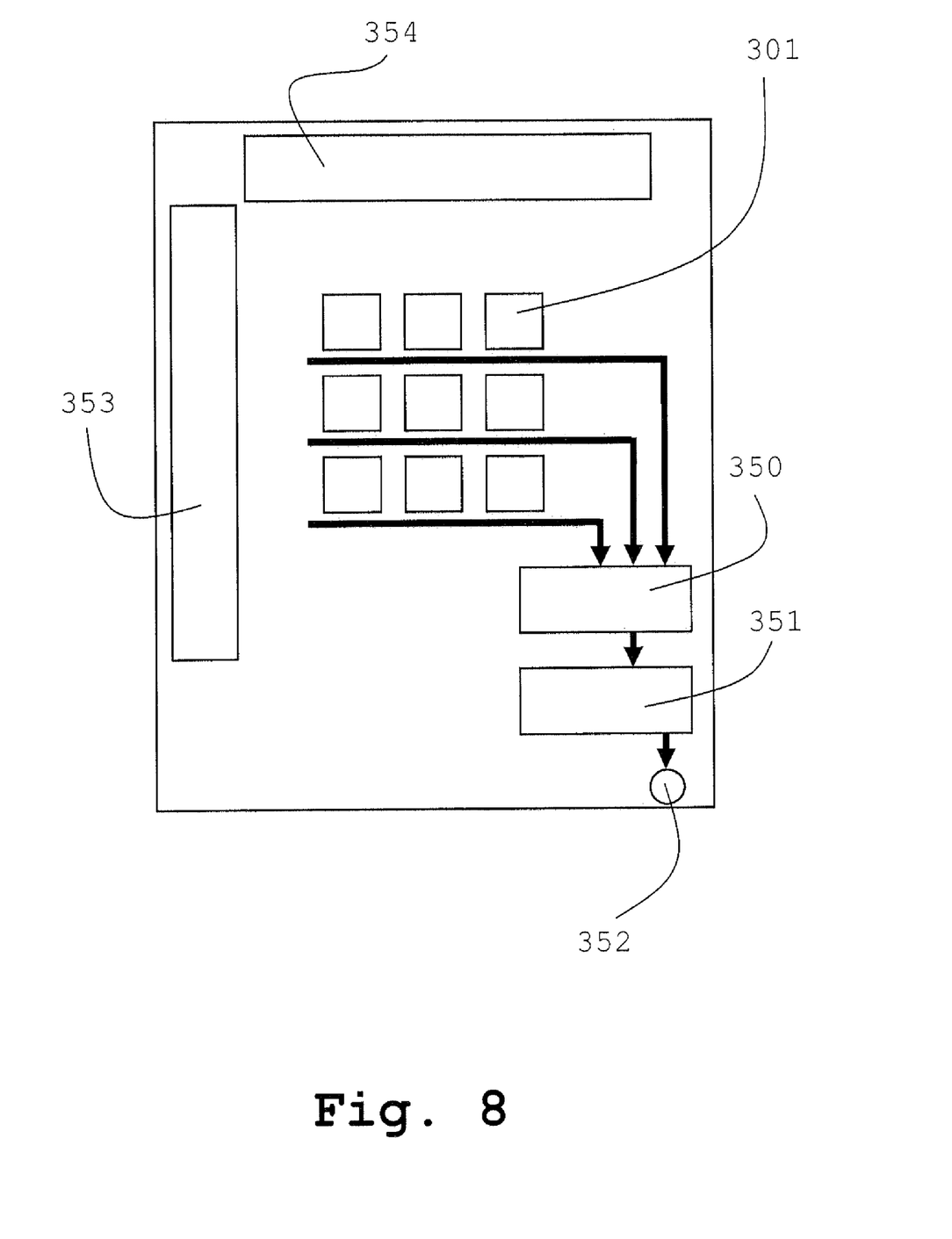
FIG. 8 is a schematic circuit diagram of a readout circuit for an array of detector cells.

In one embodiment of the present invention an analogue-to-digital converter 350 that converts the analogue information of the counters 230, 231 to a digital stream that can be transferred to off-chip electronics for further processing is embedded. This eliminates the risk inherent in analogue systems that when transferring analogue signals over long distances some of the signal dynamics are lost. In FIG. 8 a schematic circuit diagram of an example of such read out circuit for an array comprising 9×9 detector cell pixels 301 is shown. However this may be only a part of a larger array. The pixels 301 in the array are preferably read out column-wise and row-wise from the output 235 of the detector cells 301 using control logic circuits 353, 354 to a multi-channel analogue-to-digital converter (ADC) 350, for example a Wilkinson ADC, and via a buffer and readout controller circuit 351 to a serial output 352. The parallel readout of data from the pixels gives a fast readout and low power consumption.

In another embodiment of the present invention the electronic circuit 212 in FIGS. 6 and 7 and the analogue-to-digital conversion that was described with reference to FIG. 8 are alternatively designed in such way that the content of both of the counters 230, 231 are converted at the same time, which saves time compared with a sequential conversion. Up to and including the counters 230, 231, the design is unchanged. The difference with respect to the previous embodiment lies in that in each detector cell 201, the analogue counters 230, 231 for dosimetry and single electron counting respectively are connected to an analogue to digital converter (ADC) 250, for example a Wilkinson ADC, see FIG. 9, wherein the analogue signals from the counters are converted to a digital signal before transferred to the readout circuit 240 and the output 235.

Figure 9:
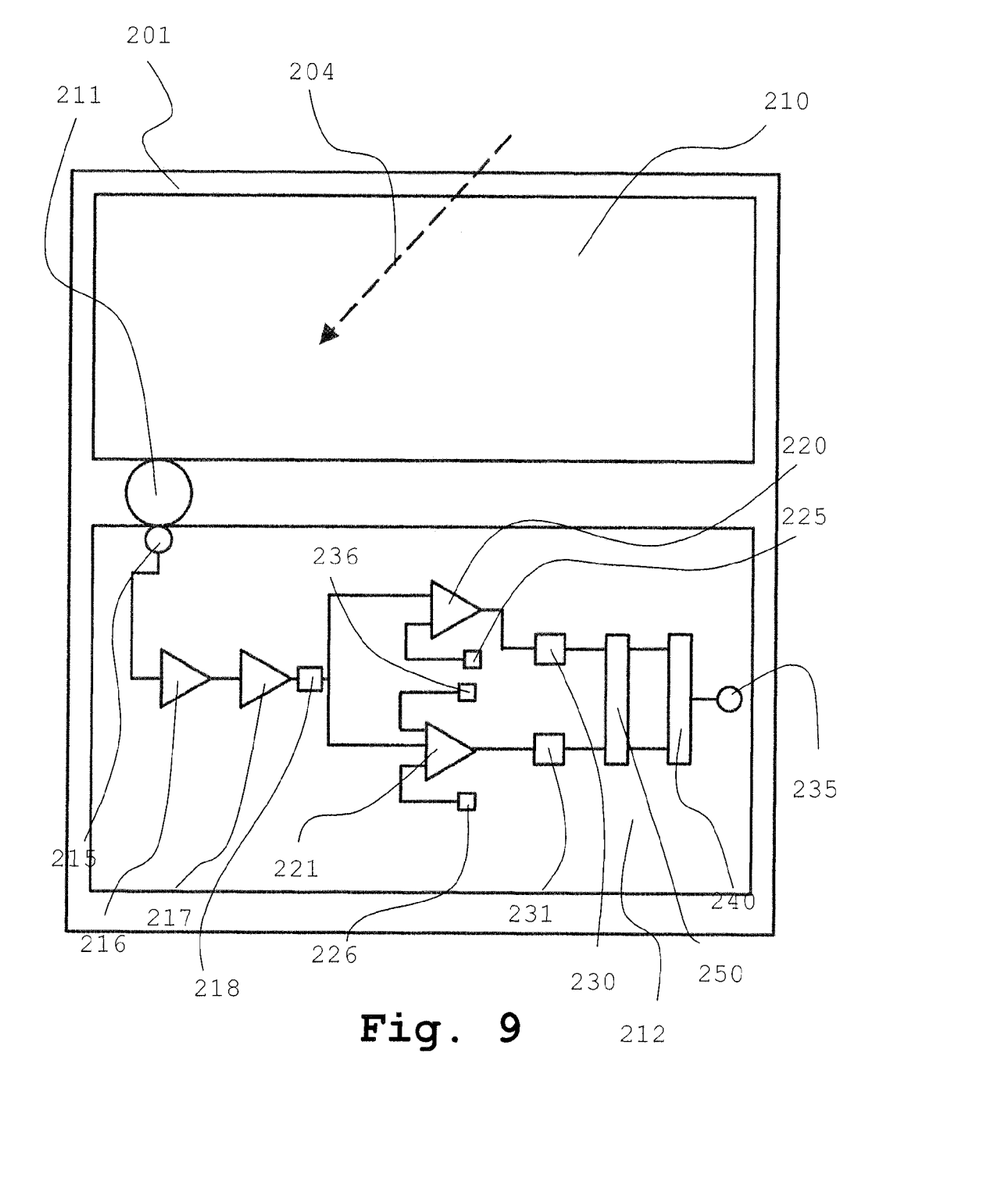
FIG. 9 is a schematic view of a detector cell.

In one possible solution for analogue to digital conversion according to this embodiment, each counter 230, 231 has a discriminator (not shown) placed thereafter. The threshold signals from threshold circuits in connection with the discriminators are simultaneously clocked over the whole dynamic range for all pixels and analogue to digital conversion of the output signal of the discriminator is, if the signal from the counter 230, 231 exceeds the threshold, performed by registering the time for this event. The digital values of each detector cell are stored in a shadow memory on the ASIC before serial read out from the ASIC.

Figure 10:
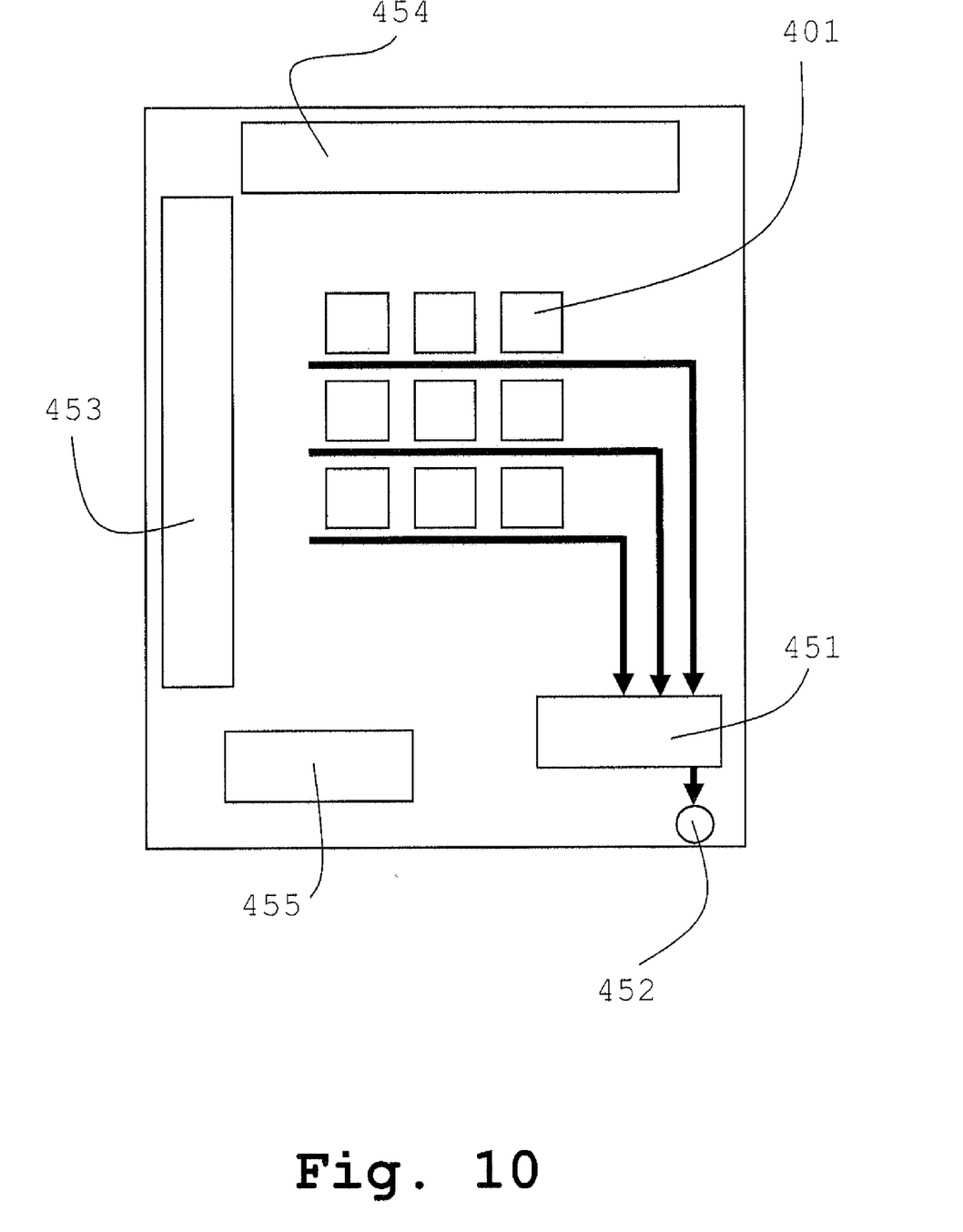
FIG. 10 is a schematic circuit diagram of a read out circuit.

The embodiment with ADC embedded in each detector cell results in an alternative design of the arrangement for readout from the detector cells as compared to the design described with reference to FIG. 8, see FIG. 10. The pixels 401 in the array are preferably read out column-wise and row-wise using control logic circuits 453, 454 and an ADC control logic circuit, via a buffer and readout controller circuit 451 to a serial output 452. This will allow digitalization of new data to go on simultaneously with serial read out of previous data.

Another embodiment of the present invention has a one-dimensional ASIC with 64 or 128 channels for readout intended for applications where the detector is scanned over the object. The design is essentially the same as for the two-dimensional device described above. Only minor corrections have to be made to the above described embodiment, e.g. the input capacitance is higher and hence an input transistor has to be dimensioned for this.

Yet another embodiment of the present invention has protection against sparks on the input, which makes the ASIC particularly advantageous for use in gaseous detectors such as ionizing chambers, gas electron multiplier or Micromegas (MicroMEsh GAseous Structure) detectors. Such gas detectors are widely used in dosimetry. Preferably, a spark changes the potential in the input circuit over a certain threshold and as a result the electronics is shut down.

Another embodiment where a large area detector surface 213 has sensor cells 210 larger than the electronics cell 212 and therefore direct ASIC to sensor flip-chip bonding is not possible. This is a likely scenario when ASIC get smaller with CMOS processes allowing small feature sizes. Here an additional fan-in layer for is added either directly by double metal-insulator processing directly on the to the sensor surface 213 or by packaging in the ASIC into a ball grid array (BGA) or similar structure that is then connected to 213.

In another embodiment of the present invention detector cells 201, as described above, are arranged in a two-dimensional array, preferably with different sizes of the detector cells 201. Preferably the central detector cells located in the central part of the detector array are small, e.g. 200×200 µm$^2$, and the peripheral detector cells are large, e.g. 1000×1000 µm$^2$, to provide high resolution preferentially for imaging in the central part and more optimized for dosimetry in the peripheral part. Thereby the dose applied to normal tissue surrounding a tumor, particularly a tumor with a diffuse extension, can be measured with high accuracy, which prevents a harmful overdose in normal tissue, while a high resolution monitoring is still possible in the tumor region. In a particular embodiment of this kind of device according to the present invention, the different sized parts of the detector array are easily removable and may be interchangeable in order to allow the detector to be easily reconfigured for certain situations, for example different shapes and/or sizes of the tumor.

While the invention has been described in connection with what is presently considered to be the most practical and preferred embodiments, it is to be understood that the invention is not to be limited to the disclosed embodiments, on the contrary, it is intended to cover various modifications and equivalent arrangements within the appended claims.

The invention claimed is:

1. Detector device for detecting ionizing radiation comprising an array of detector cells, wherein each detector cell comprises a sensor cell that generates a charge signal in response to an incident radiation hit and an electronic circuit connected to its sensor cell, the charge signal being converted to a voltage signal in the electronic circuit, wherein the electronic circuit is adapted to substantially simultaneously perform two different measurements on the voltage signal in order to simultaneously provide imaging and dosimetry.

2. Detector device according to claim 1, wherein the electronic circuit comprises at least two discriminators and at least two analogue counters, wherein: the voltage signal is duplicated into a first and a second discriminator respectively; the first discriminator is adapted to compare the voltage signal with a first threshold level; a first analogue counter for dosimetry connected to the first discriminator is adapted to integrate a voltage signal exceeding the first threshold level; the second discriminator is adapted to compare the voltage signal with a second threshold level; and, a second analogue counter for counting single radiation hits connected to the second discriminator is adapted to record a radiation hit for each voltage signal exceeding the second threshold level.

3. Detector device according to claim 2, wherein the second discriminator is adapted to compare the voltage signal with the second threshold level and a third threshold level, the third threshold level being higher than the second threshold level and the second and the third threshold levels defining an energy window; and the second analogue counter for counting single radiation hits connected to the second discriminator is adapted to record a radiation hit for each voltage signal that is within the energy window.

4. Detector device according to claim 2, wherein at least one of the threshold levels is adjustable.

5. Detector device according to claim 2, wherein an analogue-to-digital converter converts analogue signals from the readout of the detector cells to digital signals that can be transferred to off-chip electronics.

6. Detector device according to claim 2, wherein an analogue-to-digital converter implemented in sequence with each analogue counter within each detector cell to convert the analogue signal from the counter to digital signals before readout from the detector cell.

7. Detector device according to claim 1, wherein the detector cell array comprises differently sized detector cells.

8. Detector device according to claim 7, wherein detector cells located in a central position of the detector cell array are smaller than detector cells located in or near the periphery of the detector cell array.

9. Detector device according to claim 7, wherein the detector cells are removably attached to the detector cell array.

10. Detector device according to claim 1, wherein each sensor cell is made of a single crystalline semiconductor material.

11. Detector device according to claim 1, wherein each sensor cell is made of diamond.

12. Detector device according to claim 1, wherein the electronic circuit is manufactured using a CMOS process with a line width less than 0.25 µm.

13. Method of substantially simultaneously performing two different measurements on a voltage signal induced by an incident radiation hit in a sensor cell in order to simultaneously perform imaging and dosimetry comprising
    duplicating the voltage signal into a first and a second discriminator respectively;
    comparing the voltage signal with a first threshold level in the first discriminator and comparing the voltage signal with at least a second threshold level in the second discriminator; and
    simultaneously integrating the voltage signal, each time the voltage signal exceeds the first threshold level, using a first counter for dosimetry connected to the first discriminator, and recording a single radiation hit, each time the voltage signal exceeds the second threshold level, using a second counter for imaging connected to the second discriminator.

14. Method according to claim 13, further comprising the step of comparing the voltage signal with a third threshold level in the second discriminator, the second and the third threshold levels defining an energy window, and wherein a single radiation hit is recorded each time the voltage signal is within the energy window.

15. Method according to claim 13, further comprising converting analogue signals originating from the counters to digital signals.

* * * * *